United States Patent
Lee et al.

(10) Patent No.: US 10,915,727 B2
(45) Date of Patent: Feb. 9, 2021

(54) OPTICAL SENSOR AND METHOD FOR FORMING THE SAME

(71) Applicant: Vanguard International Semiconductor Corporation, Hsinchu (TW)

(72) Inventors: Hsin-Hui Lee, Kaohsiung (TW); Han-Liang Tseng, Hsinchu (TW); Hsueh-Jung Lin, Jhubei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 10 days.

(21) Appl. No.: 16/235,871

(22) Filed: Dec. 28, 2018

(65) Prior Publication Data

US 2020/0210669 A1    Jul. 2, 2020

(51) Int. Cl.
*G06K 9/00* (2006.01)
*H01L 27/146* (2006.01)
*G02B 27/30* (2006.01)

(52) U.S. Cl.
CPC .......... *G06K 9/0004* (2013.01); *G02B 27/30* (2013.01); *H01L 27/14601* (2013.01); *H01L 27/14678* (2013.01)

(58) Field of Classification Search
None
See application file for complete search history.

(56) References Cited

U.S. PATENT DOCUMENTS

| 2008/0116537 | A1  | 5/2008  | Adkisson et al. |
| 2009/0315131 | A1  | 12/2009 | Hung et al. |
| 2016/0132712 | A1* | 5/2016  | Yang ................. G06F 3/044 348/77 |
| 2016/0224816 | A1* | 8/2016  | Smith ................ G02B 27/58 |
| 2017/0228529 | A1  | 8/2017  | Huang et al. |
| 2018/0031742 | A1* | 2/2018  | Lai .................... G02B 5/003 |
| 2019/0050621 | A1* | 2/2019  | Xu .................... G06F 21/32 |
| 2019/0129530 | A1* | 5/2019  | Shen ................. H01L 27/124 |

FOREIGN PATENT DOCUMENTS

TW        M553018 U        12/2017

OTHER PUBLICATIONS

Taiwanese Office Action and Search Report dated Nov. 29, 2019, for Taiwanese Application No. 107132947.

* cited by examiner

*Primary Examiner* — Nicholas J Lee
(74) *Attorney, Agent, or Firm* — Birch, Stewart, Kolasch & Birch, LLP

(57) ABSTRACT

An optical sensor includes a substrate and a light collimating layer. The substrate includes a sensor pixel array having a plurality of sensor pixels. The light collimating layer is disposed on the substrate. The light collimating layer includes a patterned seed layer, a plurality of transparent pillars, a metal layer, and a mask layer. The patterned seed layer is disposed on the substrate. The patterned seed layer exposes the sensor pixel array. The transparent pillars are disposed on the sensor pixel array. The metal layer is disposed on the patterned seed layer and in between the transparent pillars. The mask layer is disposed on the metal layer.

24 Claims, 11 Drawing Sheets

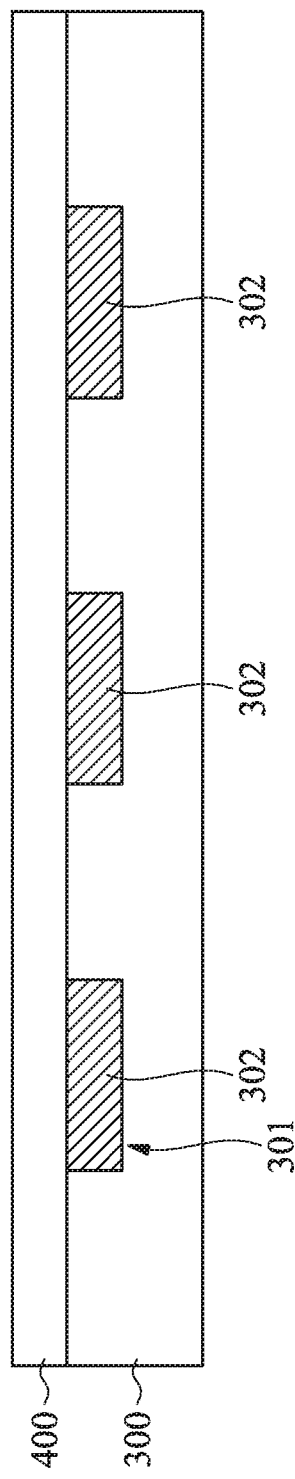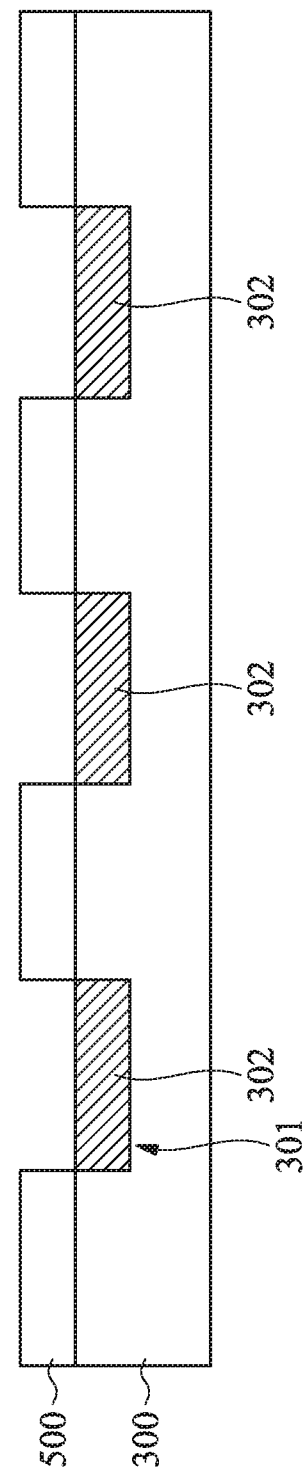

OPTICAL SENSOR AND METHOD FOR FORMING THE SAME

BACKGROUND

Technical Field

The disclosure relates to an optical element, and more particularly to an optical sensor and a method for forming the same.

Description of the Related Art

Current mobile electronic devices such as cellphones, tablets, and notebooks are usually equipped with user identification systems for protecting personal information. Fingerprint sensing is a common and reliable user identification system because everyone's fingerprints are different.

Conventional fingerprint sensors usually rely on optical technologies to detect the fingerprints of a user. Optical elements of the fingerprint sensors which are based on optical technologies may include a light collimator, a beam splitter, a focusing lens, and a linear sensor, wherein the light collimator is utilized to ensure that light which is incident to the sensor is parallel, to reduce energy loss from divergent light. However, during the process of manufacturing the light collimator, the interior structure of the light collimator can affect the performance of the light collimator and further affect the production yield of optical fingerprint sensors.

While existing collimators have been generally adequate for their intended purposes, they have not been satisfactory in all respects. There is a particular need for further improvements in the structural strength of the light collimators used in fingerprint sensors.

SUMMARY

In one embodiment of the present disclosure, an optical sensor is provided, wherein the optical sensor includes a substrate and a light collimating layer. The substrate includes a sensor pixel array, wherein the sensor pixel array has a plurality of sensor pixels. The light collimating layer is disposed on the substrate. The light collimating layer includes: a patterned seed layer disposed on the substrate and exposing the sensor pixel array; a plurality of transparent pillars disposed on the sensor pixel array; a metal layer disposed on the patterned seed layer and in between the plurality of transparent pillars; and a mask layer disposed on the metal layer.

In one embodiment of the present disclosure, a method for forming an optical sensor is provided, wherein the method includes: providing a substrate having a sensor pixel array, wherein the sensor pixel array comprises a plurality of sensor pixels; and forming a light collimating layer on the substrate. The steps for forming a light collimating layer on the substrate include: forming a patterned seed layer on the substrate, wherein the patterned seed layer exposes the sensor pixel array; forming a plurality of transparent pillars on the sensor pixel array; after forming the plurality of transparent pillars, forming a metal layer on the patterned seed layer and in between the plurality of transparent pillars; and forming a mask layer on the metal layer.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

FIGS. 3-8 are cross-sectional views illustrating various steps in the process of manufacturing an optical sensor, according to some embodiments of the present disclosure.

DETAILED DESCRIPTION

Figure 1:
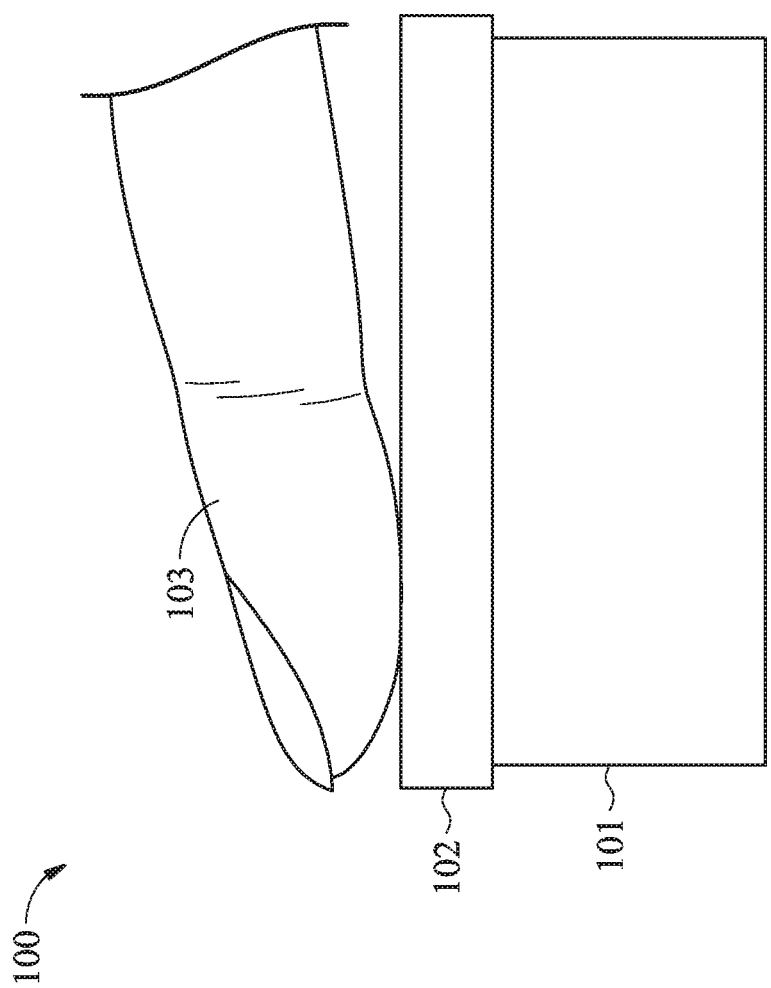
FIG. 1 is a schematic view illustrating an optical sensing device detecting an image from an object, according to some embodiments of the present disclosure.

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "over", "below," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented and the spatially relative descriptors used herein may likewise be interpreted accordingly.

The terms "about", "approximately", and "substantially" used herein generally refer to the value of an error or a range within 20 percent, preferably within 10 percent, and more preferably within 5 percent, within 3 percent, within 2 percent, within 1 percent, or within 0.5 percent. If there is no specific description, the values mentioned are to be regarded as an approximation that is an error or range expressed as "about", "approximate", or "substantially".

Although some embodiments are discussed with operations performed in a particular order, these operations may be performed in another logical order. Some of the steps that are described can be replaced or eliminated for different embodiments. Additional operations can be provided before, during, and/or after the steps described in the embodiments of present disclosure. Additional features can be provided to the fingerprint sensors in embodiments of the present disclosure. Some of the features described below can be replaced or eliminated for different embodiments.

The present disclosure provides embodiments of an optical sensor and a method for forming the same, and particularly provides an optical sensor for a fingerprint sensing system. A light collimating layer of the optical sensor provided in the embodiments of the present disclosure includes a plurality of transparent pillars disposed on a sensor pixel array and a metal layer disposed in between the transparent pillars. The transparent pillars formed on the sensor pixel array can prevent the sensor pixel array from being covered by debris, contaminants, or portions of collapsing structures from the light collimating layer during manufacture. In addition, a mask layer is formed on the metal layer to prevent crosstalk of lights that are incident to the sensor, which further enhances the performance of the optical sensor.

Traditionally, during the process of manufacturing an optical sensor for forming a light collimating layer, it is common to form a pillar-shaped opening on a sensor pixel to guide light to the sensor pixel at a near vertical angle. However, during the conventional manufacturing process, debris and contaminants can often fall into the pillar-shaped opening, thereby obstructing the sensor pixel. As a result, the sensitivity of the optical sensor is significantly reduced. The embodiments of the present disclosure form a plurality of transparent pillars on sensor pixels, and a metal layer is disposed in between the transparent pillars to form a light collimating layer. This effectively prevents the sensor pixels from being obstructed by debris or contaminants during the manufacturing process and significantly enhances the production yield. In addition, a mask layer can be further formed on the metal layer which is disposed in between the transparent pillars to prevent crosstalk of lights that are incident to the optical sensor, thereby enhancing the performance of the optical sensor.

According to some embodiments of the present disclosure, an example of an optical sensing device 100 detecting an image from an object 103 (e.g. a fingerprint) is shown in FIG. 1. The optical sensing device 100 includes a cover layer 102 and an optical sensor 101 under the cover layer 102. Other elements of the optical sensing device 100, such as the optical sensor 101 under the cover layer 102, are protected by the cover layer 102. The material of the cover layer 102 may be a transparent material, such as glass, quartz, sapphire, or a transparent polymer, to allow lights to pass through. When the object 103 comes into contact with the upper surface of the cover layer 102, light emitted from a light source (not shown) may be reflected by the object 103 to the optical sensor 101 for detection. The object 103 includes various different contours, such as convex and concave portions (not shown). As a result, when the object 103 comes into contact with the upper surface of the cover layer 102, the convex portions of the object 103 may come into contact with the upper surface of the cover layer 102, but the concave portions of the object 103 may not come into contact with the upper surface of the cover layer 102. In other words, an air gap is formed between the concave portions of the object 103 and the upper surface of the cover layer 102. Thus, the intensities of light received by the sensor pixels under the convex portions and the concave portions may be different, and thereby the various different contours of the object 103 may be identified.

Figure 2:
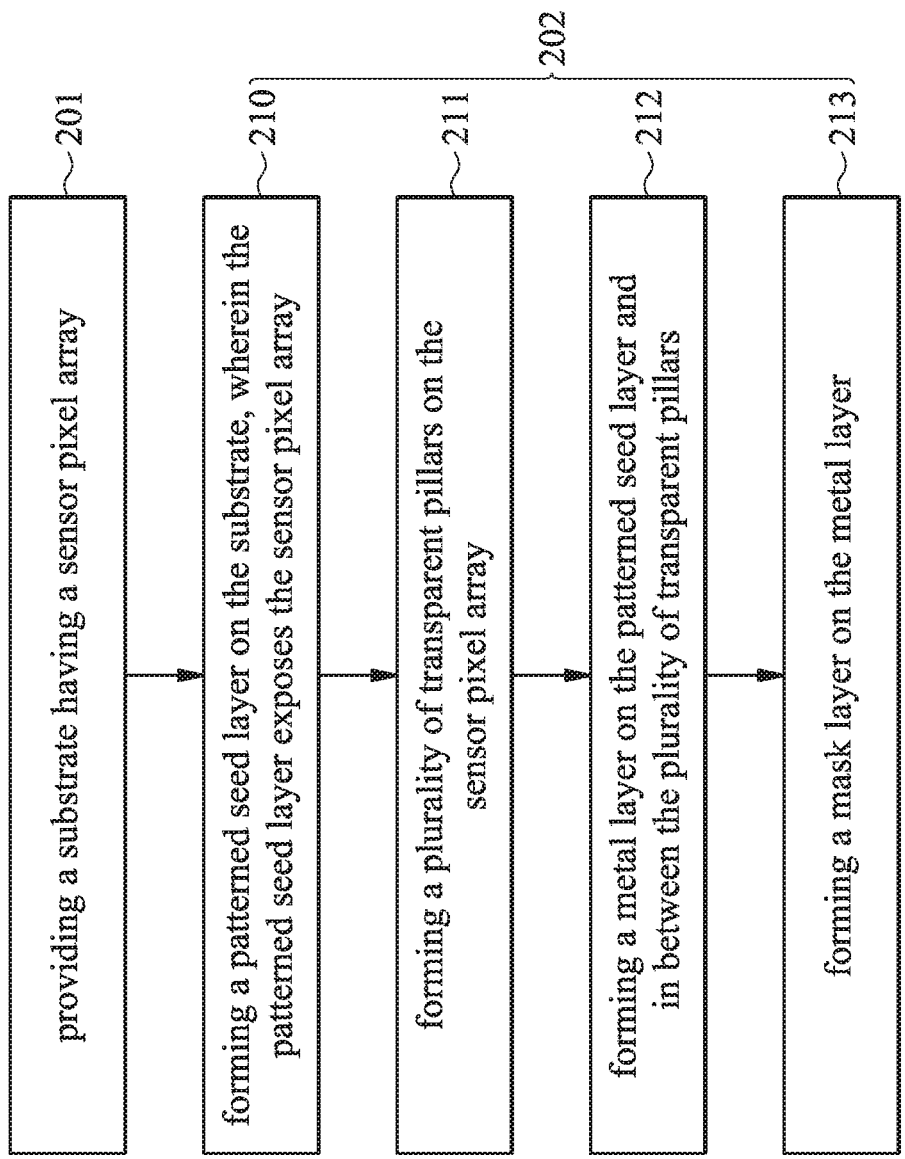
FIG. 2 is a schematic view illustrating an exemplary flow chart of a method for forming an optical sensor, according to some embodiments of the present disclosure.

FIG. 2 is a schematic view illustrating an exemplary flow chart of a method for forming an optical sensor according to some embodiments of the present disclosure. In some embodiments, FIG. 2 illustrates that a substrate having a sensor pixel array is provided in step 201 and a light collimating layer is formed on the substrate in step 202, wherein steps 210 to 213 are further included in step 202 for forming the light collimating layer. Some embodiments of the present disclosure will be described in more detail with reference to steps 210-213 and FIGS. 3-9. It should be noted that the order of the steps shown in FIG. 2 is merely exemplary unless otherwise specified, and the method for forming an optical sensor in the present disclosure is not limited to this order.

A detailed description is given in the following embodiments with reference to a method for forming an optical sensor 101 in FIG. 2 and cross-sectional views illustrating various steps in the process of manufacturing an optical sensor in FIGS. 3-9.

Figure 3:
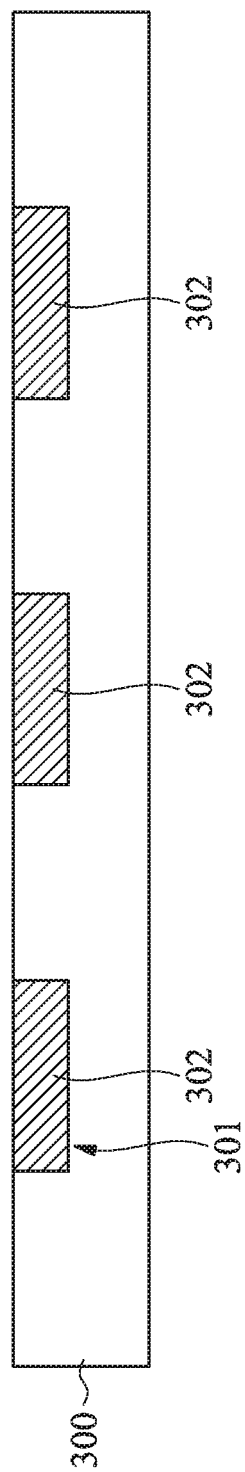

Referring to step 201 of FIG. 2 along with FIG. 3, in some embodiments, a substrate 300 having a sensor pixel array 301 is provided. The substrate 300 may be a semiconductor substrate, such as a silicon substrate. Furthermore, in some embodiments, the semiconductor substrate may be an elemental semiconductor including germanium, a compound semiconductor including gallium nitride, silicon carbide, gallium arsenide, gallium phosphide, indium phosphide, indium arsenide, and/or indium antimonide, an alloy semiconductor including SiGe, GaAsP, AlInAs, AlGaAs, GaInAs, GaInP, and/or GaInAsP, or a combination thereof. In other embodiments, the substrate 300 may also be a semiconductor on insulator substrates, the semiconductor on insulator substrates may include a substrate, a buried oxide layer disposed on the substrate, and a semiconductor layer disposed on the buried oxide layer. In addition, the conductivity type of the substrate 300 may be N-type or P-type.

In some embodiments, the substrate 300 may include various isolation features (not shown) to define an active region and electronically isolate active elements in or on the substrate 300. In some embodiments, examples of the isolation features include shallow trench isolation (STI) features, local oxidation of silicon (LOCOS) features, other suitable isolation features, or combinations thereof. In some embodiments, for example, forming the isolation features may include forming an isolation layer on the substrate 300, selectively etching the isolation layer and the substrate 300 to form trenches in the substrate 300, growing a nitrogen-rich (e.g., silicon oxynitride) liner layer in the trenches, filling insulating materials (e.g., silicon dioxide, silicon nitride, or silicon oxynitride) in the trenches using a deposition process, performing an annealing process on the insulating materials in the trenches, and performing a planarization process such as a chemical mechanical polishing (CMP) process on the substrate 300 to remove excess insulating materials and make the insulating materials in the trenches level with the top surface of the substrate 300.

In some embodiments, the substrate 300 may include various P-type doped regions and/or N-type doped regions which are formed by an ion implantation and/or a diffusion process. In some embodiments, the doped regions may be formed into transistors, photodiodes, etc. However, these elements are merely exemplary, and the present disclosure is not limited thereto.

In some embodiments, the substrate 300 may includes various conductive features, such as a conductive line or a via (not shown). For example, the conductive features may be made of aluminum, copper, tungsten, other suitable conductive materials, an alloy thereof, or a combination thereof.

Referring to FIG. 3, in some embodiments, a sensor pixel array 301 included in the substrate 300 has a plurality of sensor pixels 302, wherein the plurality of sensor pixels 302 may connect signal processing circuitry (not shown). In some embodiments, the number of sensor pixels 302 included in the sensor pixel array 301 depends on the size of the area of the optical sensing region. Each of the sensor pixels 302 may include one or more photodetectors. In some embodiments, the photodetector may include photodiodes, wherein the photodiodes may include a photoelectric material made of a sandwich structure composed of a P-type semiconductor layer, an intrinsic layer, and an N-type semiconductor layer. In the sandwich structure, the intrinsic layer receives light to produce excitons, and the excitons decompose into electrons and holes at a junction between the P-type semiconductor layer and the N-type semiconductor layer to produce current signals. In other embodiments, the photodetector may also include a charged coupling device (CCD) sensor, a complimentary metal-oxide-semiconductor (CMOS) image sensor, an active sensor, a passive sensor, other suitable sensors, or a combination thereof. In some embodiments, the plurality of sensor pixels 302 may transform the received optical signals into electronic signals through a photodetector, and process the electronic signals through the signal processing circuitry.

In some embodiments, as shown in a cross-sectional view in FIG. 3, the sensor pixels 302 are arranged in an array to form a sensor pixel array 301, wherein the sensor pixel array 301 is disposed in the top surface of the substrate 300. It should be noted that the number and arrangement of the sensor pixel array 301 are merely exemplary, and the present disclosure is not limited thereto. The plurality of sensor pixels 302 may be formed into an array with any number of rows, or in any other arrangement.

Referring to step 210 of FIG. 2 along with FIGS. 4-5, a patterned seed layer 500 is formed on the substrate 300, wherein the patterned seed layer 500 exposes the sensor pixel array 301. As shown in FIG. 4, in some embodiments, a seed layer 400 is blanketly deposited on the substrate 300 at first. The material of the seed layer 400 may include titanium, copper, other suitable materials, or a combination thereof. In some embodiments, the seed layer 400 may be deposited by a chemical vapor deposition (CVD) process, a physical vapor deposition (PVD) process (e.g., a vacuum evaporation process, a sputtering process, or a pulsed laser deposition (PLD)), an atomic layer deposition (ALD) process, other suitable deposition processes, or a combination thereof. In some embodiments, the thickness of the seed layer 400 which is formed by the process above is in a range from about 50 nanometers (nm) to about 5000 nm, such as 3000 nm. In other embodiments, the thickness of the seed layer 400 is in a range from about 100 nm to about 3000 nm.

As shown in FIG. 5, in some embodiments, the seed layer 400 is selectively removed to expose the sensor pixel array 301 on the substrate 300. In some embodiments, the shape of the patterned seed layer 500 and the shape of the sensor pixel array 301 are complementary from a top view. In some embodiments, a patterning process may be performed to selectively remove the seed layer, wherein the patterning process may include a photolithography process and an etching process. The photolithography process may include photoresist coating (e.g., spin-coating), soft baking, exposure, post-exposure baking, photoresist developing, rinsing and drying (e.g., hard baking), other suitable processes, or a combination thereof. The etching process may include such as a wet etching process, a dry etching process (e.g., reactive ion etch (RIE), plasma etching, or ion milling), other suitable processes, or a combination thereof.

Figure 6:
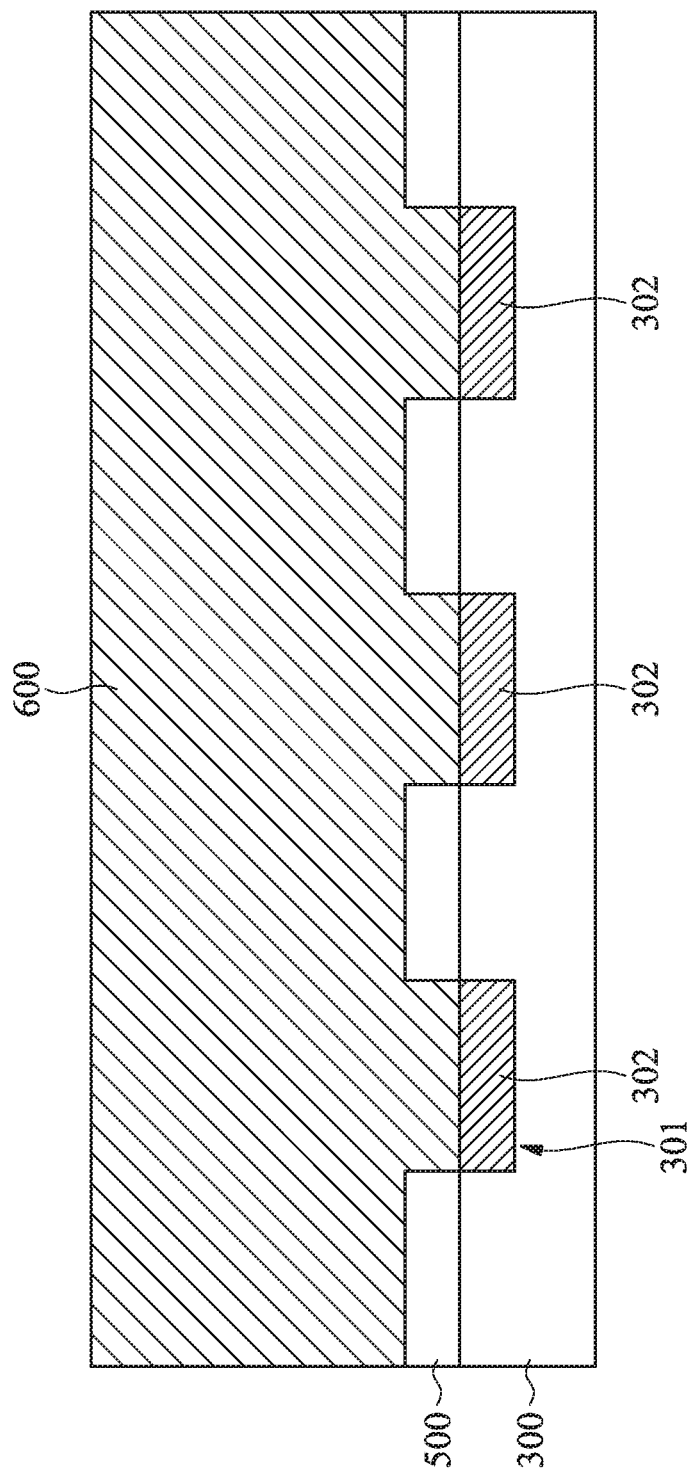
Figure 7:
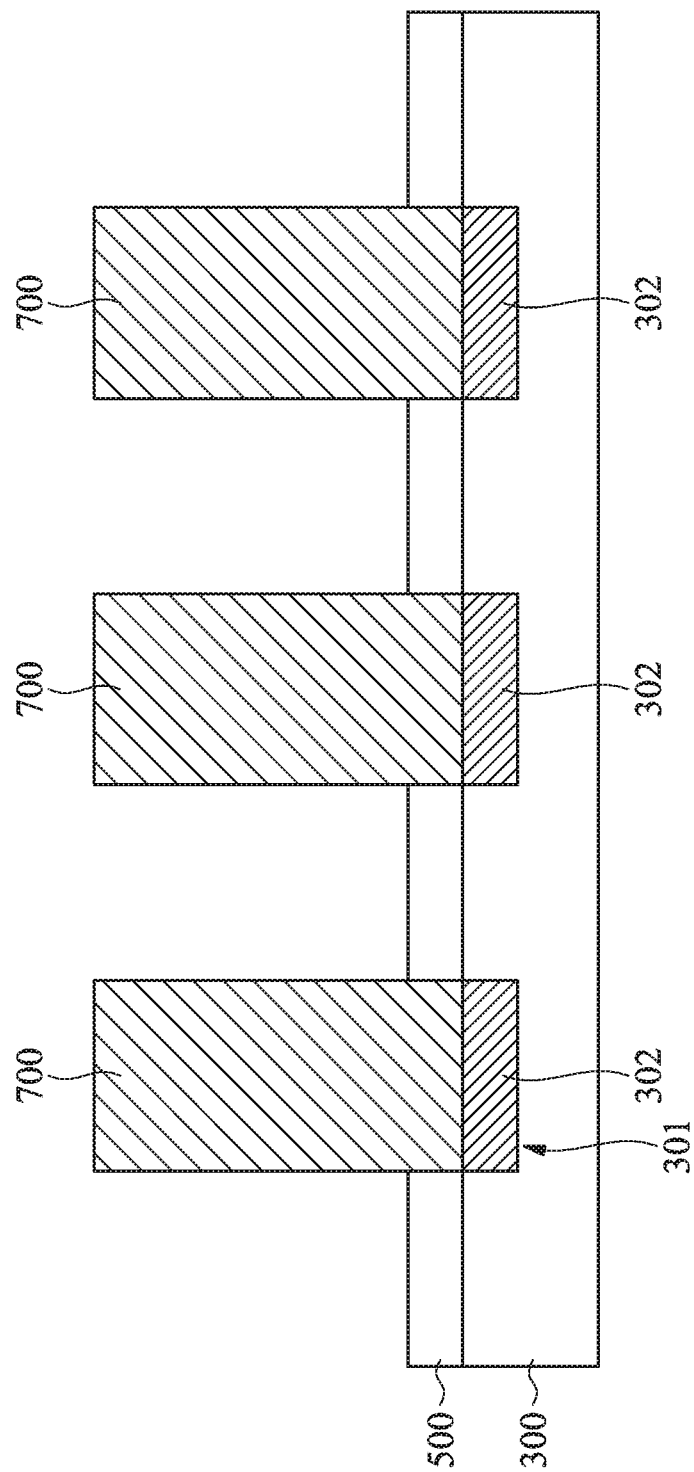

Referring to step 211 of FIG. 2 along with FIGS. 6-7, a plurality of transparent pillars 700 are formed on the sensor pixel array 301. As shown in FIG. 6, in some embodiments, a transparent layer 600 may be blanketly formed on the patterned seed layer 500 which is on the substrate 300 to cover the patterned seed layer 500 and the exposed sensor pixel array 301, wherein the exposed sensor pixel array 301 comes into direct contact with the transparent layer 600. In some embodiments, the transparent layer 600 may include a transparent material, wherein the light transmittance of the transparent material to light with a wavelength in a range from 300 nm to 1200 nm is greater than 90%, and thereby portions of incident lights are allowed to pass through the transparent layer 600 to reach the plurality of sensor pixels 302.

In some embodiments, the transparent layer 600 may include a UV-curable material, a thermosetting material, or a combination thereof. For example, the transparent material may include polymethyl methacrylate (PMMA), polyethylene terephthalate (PET), polyethylene naphthalate (PEN), polycarbonate (PC), perfluorocyclobutyl (PFCB) polymer, polyimide (PI), acrylic resins, epoxy resins, polypropylene (PP), polyethylene (PE), polystyrene (PS), polyvinyl chloride (PVC), other suitable materials, or a combination thereof. In some embodiments, the transparent layer 600 may be formed on the substrate 300 through a process such as spin-coating, casting, bar coating, blade coating, roller coating, wire bar coating, dip coating, chemical vapor deposition, other suitable processes, or a combination thereof. In some embodiments, the thickness of the transparent layer 600 formed by the process above is in a range from about 10 micrometers (um) to about 500 um, such as 60 um. In other embodiments, the thickness of the transparent layer 600 is in a range from about 50 um to about 300 um, such as 100 um.

As shown in FIG. 7, in some embodiments, the transparent layer 600 formed on the substrate 300 is selectively removed to form a plurality of transparent pillars 700 on the sensor pixel array 301, each of which corresponds to a sensor pixel 302. In some embodiments, a patterning process may be performed to selectively remove the transparent layer 600, wherein the patterning process may include a photolithography process and an etching process. The photolithography process may include photoresist coating (e.g., spin-coating), soft baking, exposure, post-exposure baking, photoresist developing, rinsing and drying (e.g., hard baking), other suitable processes, or a combination thereof. The etching process may include such as a wet etching process, a dry etching process (e.g., reactive ion etch (RIE), plasma etching, or ion milling), other suitable processes, or a combination thereof.

In other embodiments, the material of the transparent layer 600 may be a photoresist material. In such cases, a plurality of transparent pillars 700 are formed on the sensor pixel array 301 directly through a photolithography process and without the need for an additional etching process. The photolithography process may include such processes as photoresist coating (e.g., spin-coating), soft baking, exposure, post-exposure baking, photoresist developing, rinsing and drying (e.g., hard baking), other suitable processes, or a combination thereof.

In some embodiments, since the transparent pillars 700 are disposed correspondingly on the sensor pixel array 301 that is exposed from the patterned seed layer 500, the shape of the transparent pillars 700 and the shape of the patterned seed layer 500 are complementary from a top view. In other embodiments, the shape of each of the transparent pillars 700 is a circle, rectangle, polygon, or a combination thereof and arranged into an array from a top view. In some embodiments, each of the transparent pillars 700 is disposed on a corresponding sensor pixel 302. In other embodiments, at least one of the transparent pillars 700 is disposed on two or more sensor pixels 302 (not shown). In this way, the transparent pillars 700 can protect the sensor pixels 302 and reduce or prevent contamination or damage to the sensor pixels 302 during the manufacturing process, which may further impact the sensitivity of the optical sensor 101.

Figure 10A:
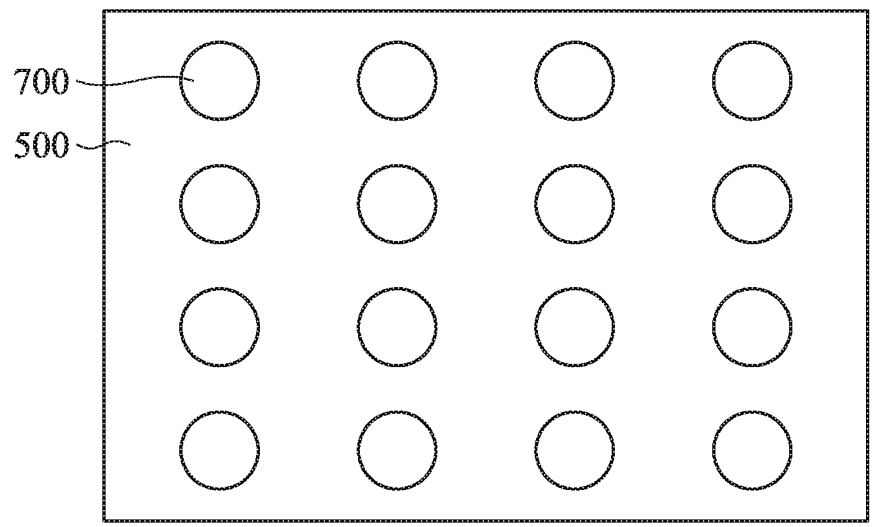
FIG. 10A is a top view illustrating an optical sensor, according to other embodiments of the present disclosure.
Figure 10B:
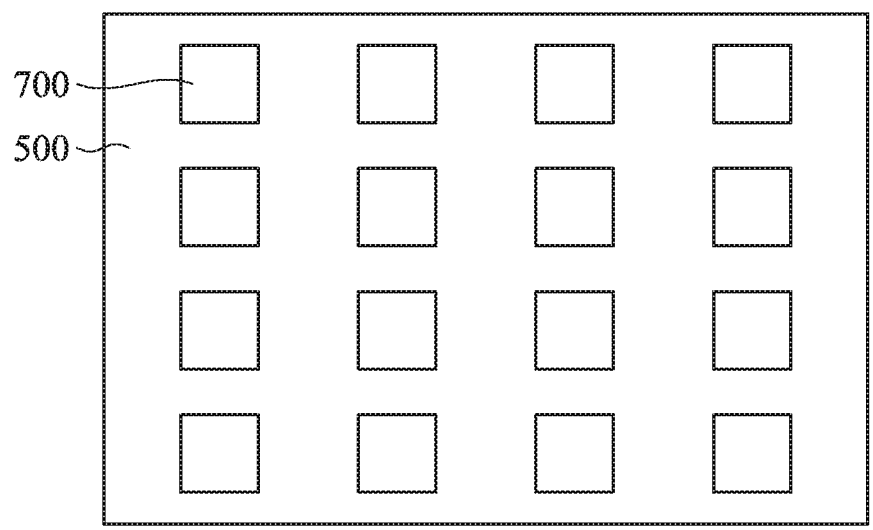
FIG. 10B is a top view illustrating an optical sensor, according to other embodiments of the present disclosure.

FIG. 10A illustrates a schematic view of a shape of cylindrical transparent pillars 700 and a shape of the patterned seed layer 500 are complementary from a top view. On the other hand, FIG. 10B illustrates a schematic view of a shape of cuboid transparent pillars 700 and a shape of the patterned seed layer 500 are complementary from a top view. It should be noted that the shape and arrangement of the transparent pillars 700 from a top view as illustrated herein are merely exemplary, and the present disclosure is not limited thereto. By disposing the plurality of transparent pillars 700 on the sensor pixel array 301 correspondingly with a complementary shape in a top view, the plurality of the sensor pixels 302 can be prevented from being obstructed by debris or contaminants produced in other processing operations of the optical sensor 101, which may impact the ability to detect incident lights.

Figure 8:
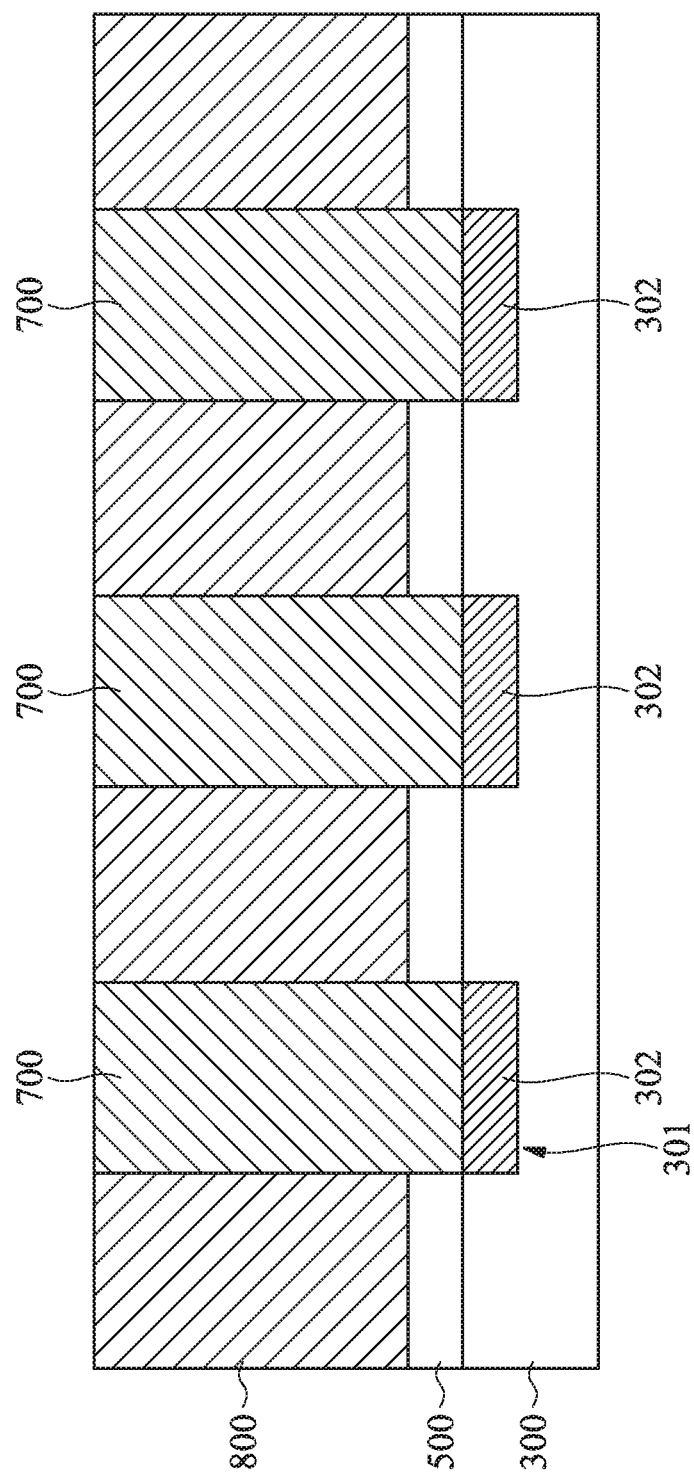

Referring to step 212 of FIG. 2 along with FIG. 8, in some embodiments, a metal layer 800 is formed on the patterned seed layer 500 on the substrate 300, and the metal layer 800 fills the spaces in between the transparent pillars 700. In some embodiments, the metal layer 800 may be formed by an electrode plating process by connecting the previously formed patterned seed layer 500, which includes a metal material, to an electrode (not shown). In some embodiments, the thickness of the metal layer 800 formed by the electrode plating process or other suitable processes is in a range from about 50 nm to about 300 nm. In some embodiments, the material of the metal layer 800 may include copper, nickel, other suitable metal materials, or a combination thereof. In some other embodiments, the materials included in the metal layer 800 and the seed layer 400/500 may be the same, for example, both of them are copper. In other embodiments, the materials included in the metal layer 800 and the seed layer 400/500 may be different. For example, the metal layer 800 includes nickel and the seed layer 400/500 includes titanium.

Figure 9A:
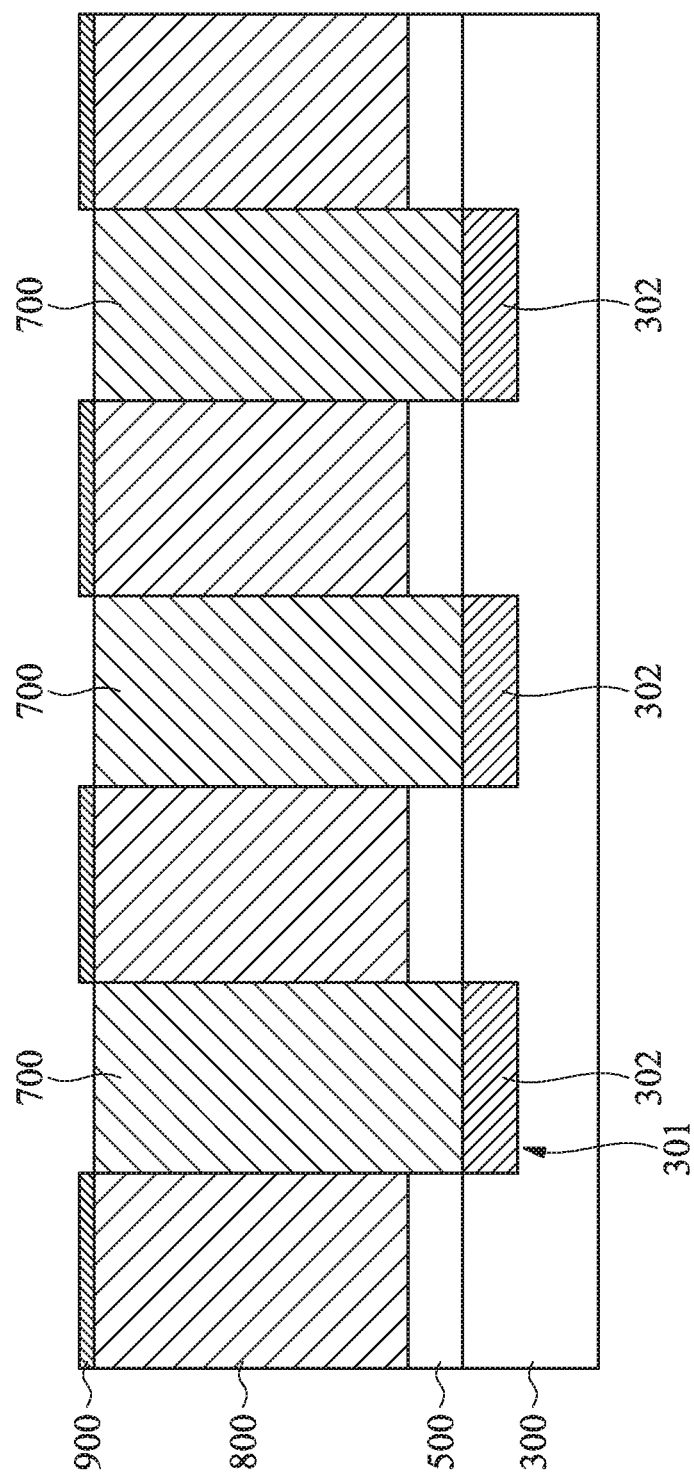
FIG. 9A is a schematic view illustrating the top surface of a mask layer being slightly higher than top surfaces of the transparent pillars, according to some embodiments of the present disclosure.
Figure 9B:
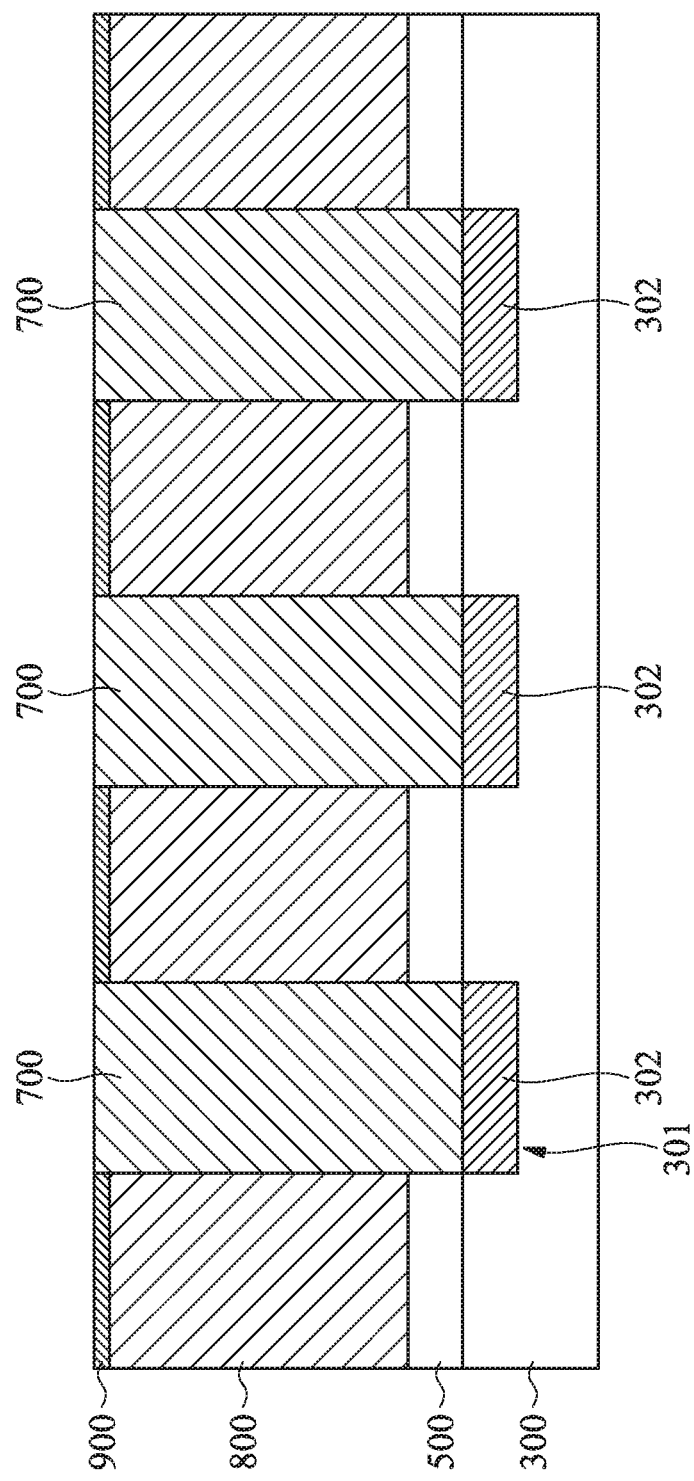
FIG. 9B is a schematic view illustrating the top surface of the mask layer being level with the top surfaces of the transparent pillars, according to some embodiments of the present disclosure.

Referring to step 213 of FIG. 2 along with FIGS. 9A-9B, in some embodiments, a mask layer 900 is formed on the metal layer 800. In some embodiments, the mask layer 900 may include light-shielding materials, such as a resin light-shielding material, wherein the light transmittance of the light-shielding material to light with a wavelength in a range from 300 nm to 1200 nm is less than 1%. The light-shielding material may include a UV-curable material, a thermosetting material, or a combination thereof. In some embodiments, the mask layer 900 formed on the metal layer 800 can prevent the sensor pixel array 301 from receiving unwanted light and the crosstalk produced from light that is incident to the optical sensor 101. This may further enhance the performance of the optical sensor 101.

In some embodiments, the light-shielding material may be formed on the metal layer 800 through a process such as spin-coating, chemical vapor deposition, other suitable processes or a combination thereof. A curing process such as a UV-curing process, a thermosetting process, or a combination thereof may be performed to cure the light-shielding material. Then, a patterning process may be performed to form the mask layer 900 on the metal layer 800. The mask layer 900 after the patterning process only covers the metal layer 800 and does not cover the transparent pillars 700. In some embodiments, the thickness of the mask layer 900 is in a range from about 10 nm to about 5000 nm, such as 100 nm. In other embodiments, the thickness of the mask layer 900 is in a range from about 0.1 um to about 5 um, such as 3 um.

In some embodiments, the light-shielding material includes non-transparent carbon black, oil ink, molding compound, solder mask, other suitable materials, or a combination thereof. In such cases, the patterning process may include a photolithography process and an etching process. The photolithography process may include photoresist coating (e.g., spin-coating), soft baking, exposure, post-exposure baking, photoresist developing, rinsing and drying (e.g., hard baking), other suitable processes, or a combination thereof. The etching process may include a wet etching process, a dry etching process (e.g., reactive ion etch (RIE), plasma etching, or ion milling), other suitable processes, or a combination thereof.

In other embodiments, the light-shielding material includes a non-transparent photoresist material. In such cases, the mask layer 900 is formed directly on the metal layer 800 through a photolithography process and without the need for an additional etching process. The photolithography process may include such processes as photoresist coating (e.g., spin-coating), soft baking, exposure, post-exposure baking, photoresist developing, rinsing and drying (e.g., hard baking), other suitable processes, or a combination thereof.

In some embodiments, before forming the mask layer 900 on the metal layer 800, a planarization process (e.g., a CMP process) may be performed to planarize the metal layer 800 so that the metal layer 800 is level with the top surface of the transparent pillars 700. Then, in the above embodiments, the top surface of the mask layer 900 on the metal layer 800 after the planarization process is slightly higher than the top surface of the transparent pillars 700. For example, the top surface of the mask layer 900 is about 10 nm higher than the top surface of the transparent pillars 700, as shown in FIG. 9A.

In other embodiments, by controlling the duration of the electrode plating process, the top surface of the metal layer 800 formed on the patterned seed layer 500 can be slightly lower than the top surface of the transparent pillars 700. For example, the top surface of the metal layer 800 is about 10 nm to about 10 um lower than the top surface of the transparent pillars 700. Then, the mask layer 900 is formed on the top surfaces of the metal layer 800 and the transparent pillars 700 so that the top surface of the mask layer 900 is slightly higher than the top surface of the transparent pillars 700. For example, the top surface of the mask layer 900 is about 10 nm higher than the top surface of the transparent pillars 700. After that, a planarization process (e.g., a CMP process) may be performed to planarize the mask layer 900 so that the mask layer 900 is level with the top surface of the transparent pillars 700, as shown in FIG. 9B.

According to some embodiments of the present disclosure, the light collimating layer formed in step 202 of FIG. 2 includes a patterned seed layer 500 exposing the sensor pixel array 301 on the substrate 300, a plurality of transparent pillars 700 disposed on the sensor pixel array 301, a metal layer 800 in between the transparent pillars 700, and a mask layer 900 disposed on the metal layer 800. In some embodiments, other optical elements may be included on the light collimating layer, such as a color filter, a glass, a lens, etc. (not shown). In some embodiments, the incident lights pass through the optical elements on the light collimating layer and are guided to the plurality of sensor pixels 302 through the light collimating layer. The aspect ratio of the transparent pillars 700 is in a range from 2 to 30, which may be 5, 10, 15, or 20. If the transparent pillars 700 are too high (i.e., the aspect ratio is too large), the transparent pillars 700 are prone to deformation and collapse, making the manufacturing process more difficult and increasing the cost of the process. If the transparent pillars 700 are too wide (i.e., the aspect ratio is too small), the optical sensor 101 is prone to receiving unwanted incident lights, making it difficult to achieve a good collimating performance and reducing the sensitivity of the optical sensor 101.

Figure 11:
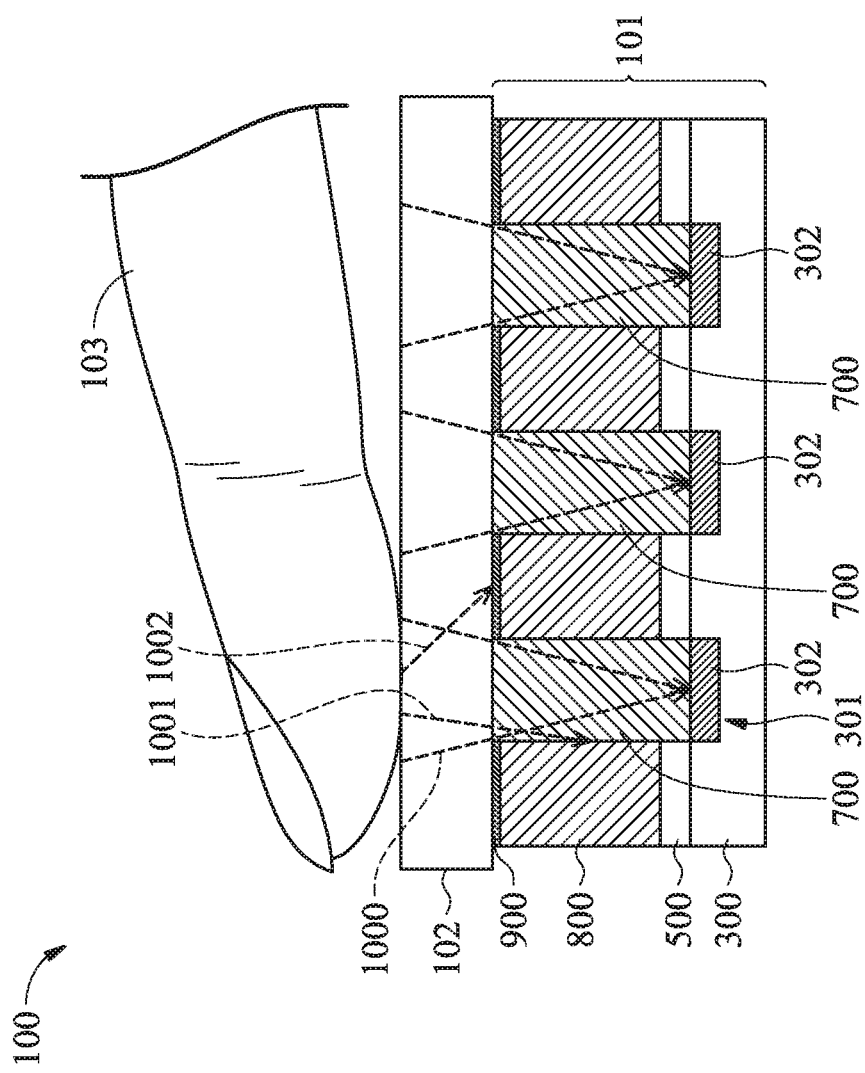
FIG. 11 is a schematic view illustrating an exemplary structure of an optical sensing device detecting an image from an object, according to some embodiments of the present disclosure.

In some embodiments, an optical sensing device 100 includes an optical sensor 101 and a cover layer 102 disposed on the light collimating layer, as shown in FIG. 11. The cover layer 102 may be a hard transparent material, such as calcium aluminosilicate glass, soda lime glass, sapphire, transparent polymers, or other suitable materials, so that at least a portion of the incident light can pass through the cover layer 102 and reach the sensor pixel array 301. Furthermore, the hard cover layer can protect the optical sensor 101 or other elements of the optical sensing device 100 that are under the hard cover layer.

FIG. 11 is a schematic view illustrating an exemplary structure of an optical sensing device 100 detecting an image from an object 103 according to some embodiments of the present disclosure. In some embodiments, as shown in FIG. 11, when the object 103 (e.g., a fingerprint) comes into contact with an upper surface of the cover layer 102, light emitted from a light source (not shown) is reflected by the object 103. A portion of the light 1002 passes through the cover layer 102 and is absorbed by the mask layer 900, another portion of the light 1000 passes through the cover layer 102 and the transparent pillar 700 to reach one of the sensor pixels 302, and still another portion of the light 1001 passes through the cover layer 102 and the transparent pillar 700 and is reflected by the metal layer 800 to irradiate one of the sensor pixels 302. The mask layer 900 and the metal layer 800 in between the transparent pillars 700 allow desirable incident light to be guided to the plurality of sensor pixels 302 to achieve the performance of collimating the incident light.

As described above, according to the embodiments of the present disclosure, in the method for forming an optical sensor, a light collimating layer is formed on a substrate which has a sensor pixel array. However, in the step for forming the light collimating layer, the forming of the transparent pillars on the sensor pixel array precedes the forming of the metal layer in between the transparent pillars. This is advantageous to prevent the sensor pixel array from being obstructed by debris or contaminants, which may reduce the yield of the manufacturing process. Otherwise the obstructed sensor pixel array may also lose the ability to detect incident light. The optical sensor and the method for forming the same provided in the embodiments of the present disclosure can not only enhance the sensitivity of the optical sensing device but also enhance the yield of the manufacturing process and reduce the cost of the process.

It should be noted that, although the exemplary embodiments disclosed in the examples described herein relate to a fingerprint sensing device, the technical features provided in the present disclosure can also be utilized in other types of sensors, and are not merely limited to a sensor device for detecting fingerprints. For example, the present disclosure can be utilized in a biosensor, a sensor device relating to medical applications (e.g., detecting heartbeat or blood oxygen level) or radiation research, etc., and it is not limited to the scope disclosed in the embodiments above.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An optical sensor, comprising:
    a substrate comprising a sensor pixel array, wherein the sensor pixel array has a plurality of sensor pixels; and
    a light collimating layer disposed on the substrate, wherein the light collimating layer comprises:
        a patterned seed layer disposed on the substrate and exposing the sensor pixel array;
        a plurality of transparent pillars disposed on the sensor pixel array;
        a metal layer disposed on the patterned seed layer and in between the plurality of transparent pillars; and
        a mask layer disposed on the metal layer, wherein the plurality of transparent pillars are made of a transparent material, and the light transmittance of the transparent material to light with a wavelength in a range from 300 nm to 1200 nm is greater than 90%.

2. The optical sensor as claimed in claim 1, wherein the patterned seed layer does not overlap with the sensor pixel array from a top view.

3. The optical sensor as claimed in claim 1, wherein the patterned seed layer comprises titanium, copper, or a combination thereof.

4. The optical sensor as claimed in claim 1, wherein shapes of the plurality of transparent pillars are circular, rectangular, polygonal, or a combination thereof from a top view.

5. The optical sensor as claimed in claim 1, wherein an aspect ratio of the plurality of transparent pillars is in a range from 2 to 30.

6. The optical sensor as claimed in claim 1, wherein each of the plurality of transparent pillars is disposed on each of the plurality of sensor pixels correspondingly.

7. The optical sensor as claimed in claim 1, wherein at least one of the plurality of transparent pillars is disposed on two or more of the plurality of sensor pixels.

8. The optical sensor as claimed in claim 1, wherein the metal layer comprises copper, nickel, or a combination thereof.

9. The optical sensor as claimed in claim 1, wherein a thickness of the metal layer is in a range from 50 nm to 300 nm.

10. The optical sensor as claimed in claim 1, wherein the mask layer is a resin mask layer, and the light transmittance of the resin mask layer to light with a wavelength in a range from 300 nm to 1200 nm is less than 1%.

11. A method for forming an optical sensor, comprising:
providing a substrate having a sensor pixel array, wherein the sensor pixel array comprises a plurality of sensor pixels; and
forming a light collimating layer on the substrate, wherein steps for forming the light collimating layer on the substrate comprise:
forming a patterned seed layer on the substrate, wherein the patterned seed layer exposes the sensor pixel array;
forming a plurality of transparent pillars on the sensor pixel array;
after forming the plurality of transparent pillars, forming a metal layer on the patterned seed layer and in between the plurality of transparent pillars; and
forming a mask layer on the metal layer, wherein the plurality of transparent pillars are made of a transparent material, and the light transmittance of the transparent material to light with a wavelength in a range from 300 nm to 1200 nm is greater than 90%.

12. The method as claimed in claim 11, wherein a plating process is performed to form the metal layer on the patterned seed layer and in between the plurality of transparent pillars.

13. The method as claimed in claim 11, wherein a planarization process is performed to planarize the metal layer before forming the mask layer on the metal layer to make the metal layer level with surfaces of the plurality of transparent pillars.

14. The method as claimed in claim 11, wherein the patterned seed layer does not overlap with the sensor pixel array from a top view.

15. The method as claimed in claim 11, wherein the patterned seed layer comprises titanium, copper, or a combination thereof.

16. The method as claimed in claim 11, wherein shapes of the plurality of transparent pillars are circular, rectangular, polygonal, or a combination thereof from a top view.

17. The method as claimed in claim 11, wherein an aspect ratio of the plurality of transparent pillars is in a range from 2 to 30.

18. The method as claimed in claim 11, wherein each of the plurality of transparent pillars is disposed on each of the plurality of sensor pixels correspondingly.

19. The method as claimed in claim 11, wherein at least one of the plurality of transparent pillars is disposed on two or more of the plurality of sensor pixels.

20. The method as claimed in claim 11, wherein the metal layer comprises copper, nickel, or a combination thereof.

21. The method as claimed in claim 11, wherein a thickness of the metal layer is in a range from 50 nm to 300 nm.

22. The method as claimed in claim 11, wherein the mask layer is a resin mask layer, and the light transmittance of the resin mask layer to light with a wavelength in a range from 300 nm to 1200 nm is less than 1%.

23. An optical sensor, comprising:
a substrate comprising a sensor pixel array, wherein the sensor pixel array has a plurality of sensor pixels; and
a light collimating layer disposed on the substrate, wherein the light collimating layer comprises:
a patterned seed layer disposed on the substrate and exposing the sensor pixel array;
a plurality of transparent pillars disposed on the sensor pixel array;
a metal layer disposed on the patterned seed layer and in between the plurality of transparent pillars; and
a mask layer disposed on the metal layer, wherein a thickness of the metal layer is in a range from 50 nm to 300 nm.

24. The optical sensor as claimed in claim 23, wherein an aspect ratio of the plurality of transparent pillars is in a range from 2 to 30.

* * * * *